United States Patent [19]

Osborne

[11] 3,750,143

[45] July 31, 1973

[54] CHARGE PARCELING INTEGRATOR

[75] Inventor: Thomas Lawrence Osborne, Georgetown, Mass.

[73] Assignee: Bell Telephone Laboratories, Inc., Murray Hill, N.J.

[22] Filed: July 18, 1972

[21] Appl. No.: 272,853

[52] U.S. Cl. ........ 340/347 AD, 325/38 B, 332/11 D, 340/347 DA, 235/183

[51] Int. Cl. ........................................... H03k 13/22

[58] Field of Search .................. 340/347 C, 347 AD, 340/347 DA; 325/38 B; 332/11 D; 235/183; 324/99 D; 328/127, 128; 307/238

[56] References Cited

UNITED STATES PATENTS

| | | | |
|---|---|---|---|
| 2,832,070 | 4/1958 | Bateman | 340/347 DA |
| 3,218,630 | 11/1965 | Jankovich | 340/347 AD |
| 3,235,862 | 2/1966 | Fiorini | 340/347 DA |
| 3,462,759 | 8/1969 | Hoffman | 340/347 AD |
| 3,626,408 | 12/1971 | Carbrey | 340/347 AD |
| 3,631,468 | 12/1971 | Spaid | 340/347 AD |

*Primary Examiner*—Charles D. Miller
*Attorney*—W. L. Keefauver et al.

[57] ABSTRACT

A charge parceling integrator for use in delta modulation encoders and decoders has its output taken from a first, or integrating, capacitor. At the start of each cycle, the voltage across this capacitor is reduced by connecting it in parallel with a second, or decrementing, capacitor which was previously discharged. When a digital 1 is the input to the decoder or the output of the encoder, a pulse is generated and applied through a third capacitor to the parallel combination of the first and second capacitors, thereby increasing the voltage across them. The ratio of the capacitor values is chosen so that the increase in voltage across the integrating capacitor when a digital 1 occurs is twice the decrease at the beginning of each cycle.

7 Claims, 3 Drawing Figures

CHARGE PARCELING INTEGRATOR

BACKGROUND OF THE INVENTION

This invention relates to integrating circuits and, more particularly, to charge parceling integrating circuits for use in delta modulation systems.

In most digital transmission systems an input analog signal is converted into a digital code by an encoder and the digital code is transmitted to a remote receiver. At the receiver, a decoder circuit converts the digital code into another analog signal which is a substantial duplicate of the original analog signal.

When a delta modulation system is used, the input analog signal at the transmitter is sampled and the sample is compared to a locally generated signal. When the sample is larger than the locally generated signal, a digital 1 is generated and transmitted. The pulse representing the digital 1 is then integrated and used to increase the value of the locally generated signal. When the local signal is larger than the sample, a digital 0 is generated and the local signal is decreased. At the receiver, this series of digital bits is integrated to recreate the original analog signal. A charge parceling integrator circuit useful in a delta modulation circuit of this type is disclosed in an article entitled "Delta Modulation Codec for Telephone Transmission and Switching Applications" by R. R. Laane and B. T. Murphy, which appeared in the *Bell System Technical Journal*, Vol. 49 (1970), at page 1013. This circuit requires two sources of charging (discharging) pulses for its operation. The charging source applies its output through a first capacitor to charge an integrating capacitor. The amount of charge depends on the ratio of the first capacitor and the integrating capacitor, and on the size of the charging pulse. This charging occurs during every cycle of operation of the integrator. However, when a digital 1 input occurs during an integrating cycle, a second pulse is generated which passes through a second capacitor and discharges the integrating capacitor by twice the amount of the charge added by the first charging source. The digital 1 present in the circuit is either generated by the encoder when the integrating circuit is used to produce the locally generated signal in the transmitter or it represents the received digital input when the integrator is used as the decoder of a receiver. The Laane circuit also has a compensation network which assures that the capacitive charge is transferred in equal steps.

The charge parceling integrator has an advantage over the common RC type integrator in that it relies only on capacitor ratio tolerances rather than on absolute resistor and capacitor tolerances. Also, timing problems are not critical when the charge parceling approach is used, provided sufficient time is allowed for charging and discharging of the small charge parceling capacitors in the integrator network. Naturally, it would greatly simplify the Laane circuit if one of the pulse charging sources and the step size compensation network could be eliminated. It is, therefore, an object of this invention to simplify a charge parceling integrator useful in delta modulation systems by eliminating one charging source and the step size compensation.

SUMMARY OF THE INVENTION

The present invention is directed toward reducing the complexity of a charge parceling integrator by eliminating the requirement for constant step size and reducing the number of charging sources. This results in reduced cost and higher reliability. In an illustrative embodiment of the invention, the output of the integrating circuit is taken from an integrating capacitor $C_1$. At the start of each timing cycle the voltage across this capacitor is decreased by connecting it, in parallel, with a decrementing capacitor $C_2$, which had previously been discharged. The amount of voltage reduction depends on the ratio of the capacitors $C_1$ and $C_2$. When a digital 1 is present in the delta modulation circuit, either as the input to a decoder circuit or as the output of an encoder circuit, a pulse is generated. This pulse is then fed to the parallel combination of capacitors $C_1$ and $C_2$ through capacitor $C_3$, thereby increasing the voltage across the integrating capacitor, $C_1$. The amount of voltage increase is determined by the ratio of capacitor $C_3$ to the parallel combination of capacitors $C_1$ and $C_2$. When the capacitors are in the proper ratio, the increase in voltage across the integrating capacitor when a digital 1 occurs will be twice the decrease at the beginning of each timing cycle. Therefore, the occurrence of a digital 1 produces a net increase across the integrating capacitor, and the absence of a digital 1 will cause a net decrease. The discharging of capacitor $C_2$ is accomplished by connecting a field-effect transistor (FET) across its terminals. This FET is turned ON at the end of each cycle, discharging capacitor $C_2$. The connection between the integrating capacitor $C_1$ and the other two capacitors of the circuit is also accomplished with an FET.

The foregoing and other features of the present invention will be more readily apparent from the following detailed description and drawings.

DETAILED DESCRIPTION

Figure 1:
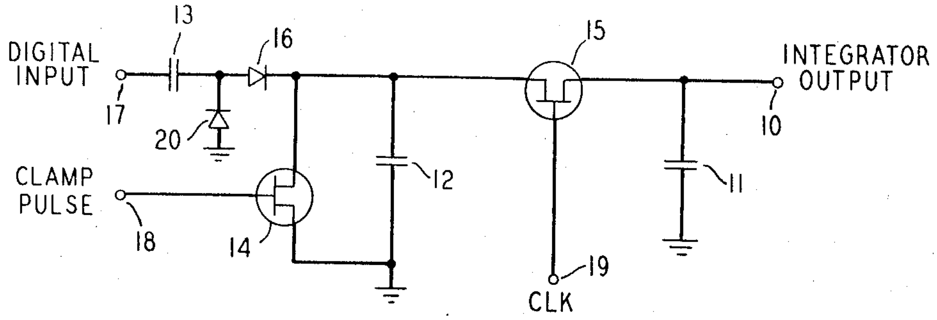
FIG. 1 is a simplified schematic of an illustra-tive embodiment of the invention.

FIG. 1 is a simplified schematic of the basic integrator circuit. The results of the integration process are represented by the voltage across integrating capacitor 11, which is connected between the output terminal 10 and ground. A decrementing capacitor, 12, also has one of its terminals connected to ground. During each cycle of integration, field-effect transistor (FET) 15 is shorted by the application of a voltage pulse at terminal 19, which is connected to its gate terminal. This causes capacitor 11 to be connected in parallel with capacitor 12, since the drain-source path of FET 15 connects the two ungrounded terminals of capacitors 11 and 12. Under normal operating conditions capacitor 12 is initially discharged. This causes part of the charge on capacitor 11 to be transferred to capacitor 12 when FET 15 is shorted, thereby decreasing the voltage across capacitor 11 in proportion to the ratio of the two capacitors. At the end of an integrating cycle FET 15 is open-circuited and capacitor 12 is discharged by FET 14, which has its drain-source path connected across capacitor 12. The discharging of capacitor 12 is accomplished by applying a voltage pulse to terminal 18, which is connected to the gate of FET 14.

Capacitor 13 of FIG. 1 is connected between digital input terminal 17 and the anode of diode 16. The cathode of diode 16 is connected to the ungrounded side of capacitor 12. In addition, a diode 20 is provided between the anode of diode 16 and ground to act as a unilateral voltage clamp. Since diode 20 has its anode connected to ground, it prevents the negative excursions of the digital pulses coupled through capacitor 13 from going below a reference level which is substantially equal to the ground level. Diode 16 allows charge to be coupled from capacitor 13 to capacitors 11 and 12, but prevents the voltage on capacitors 11 and 12 from affecting capacitor 13 when there is no digital input to terminal 17. When a digital 1 is present at terminal 17 during the integration cycle, charge is transferred through the combination of capacitor 13 and diode 16 to the parallel combination of capacitors 11 and 12. This causes a net increase in the voltage across capacitor 11, depending on the ratios of capacitors 11, 12 and 13. When these ratios are properly selected the voltage across capacitor 11 will decrease during the application of the clock signal at terminal 19. Then, if a digital 1 appears after the clock signal, the voltage across capacitor 11 will increase by twice the amount of the decrease during the clock period. After this period, the clamp signal appears at terminal 18, discharging capacitor 12, thereby preparing the circuit for the next cycle. With this form of operation the integrator output decreases at the beginning of each cycle and increases by twice the decrease whenever a digital 1 is present. Therefore, the occurrence of a digital 1 produces a net increase of one unit and the absence of a digital 1 produces a net decrease of one unit.

Figure 2:
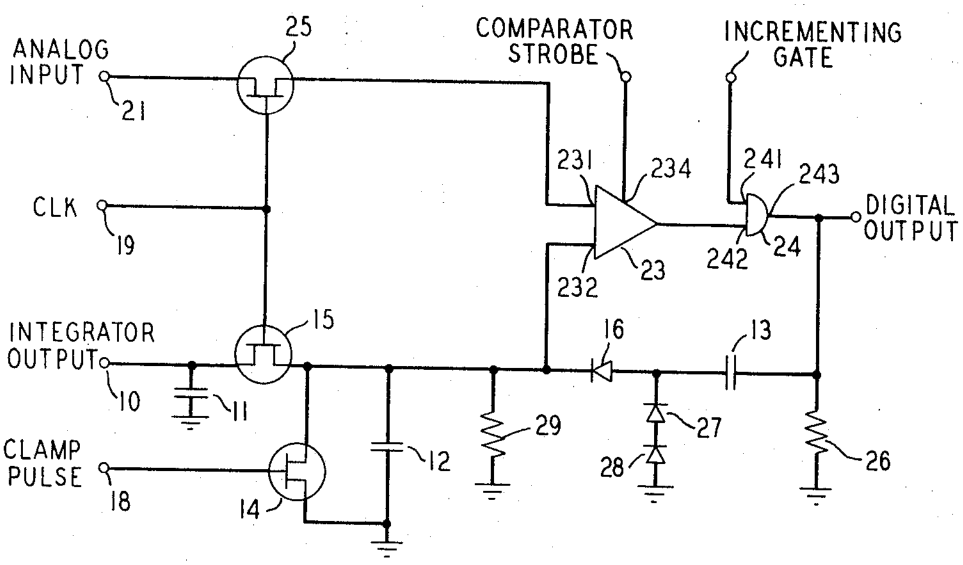
FIG. 2 is a more detailed schematic of an illustrative embodiment of the invention used in a delta modulation encoder.

This type of integrator is particularly useful in delta modulation systems. An illustrative embodiment of this circuit in a delta modulation encoder is shown in FIG. 2. The parts of the circuit which are the same as those shown in FIG. 1 have been given the same numerical designation in FIG. 2.

In FIG. 2 FET 25 is connected between the analog input terminal 21 and the first terminal, 231, of comparator 23. During the occurrence of the clock signal at terminal 19, FET 25 is shorted, thereby sampling the input analog voltage. An integrating capacitor, 11, is connected between ground and output terminal 10. This output terminal 10 is also connected to input terminal 232 of comparator 23 through the drain-source path of FET 15. In addition, capacitor 12 is connected between input terminal 232 and ground. With the application of the clock pulse at terminal 19, FET 25 allows a sample of the input analog signal to be applied to input terminal 231 of comparator 23 and also applies the voltage across the parallel combination of capacitors 11 and 12 to terminal 232 of caparator 23. The voltage across the parallel combination of capacitors 11 and 12 equals the previous voltage across capacitor 11 decreased by the charge redistribution caused by capacitor 12. Comparator 23 then determines whether the voltage at terminal 231 is larger than the voltage at terminal 232. When it is, the comparator generates a 1 output, otherwise the comparator generates a 0 output. The output of the comparator is then applied to terminal 242 of AND gate 24 and an incrementing gate pulse is applied to terminal 241 of gate 24. In order to assure proper timing of the integrating portion of the circuit, the comparator output is held constant by the occurrence of the comparator strobe pulse at terminal 234 during the time the incrementing gate pulse is applied to terminal 241. The output of AND gate 24 is developed across a resistor 26, connected between the output terminal 243 and ground. This output voltage represents the digital delta modulation output code and also represents the digital input for the integrating portion of the circuit.

The integrating portion of the circuit has capacitor 13 connected between the output terminal 243 of AND gate 24 and the anode of diode 16. The cathode of diode 16 is connected to terminal 232 of comparator 23. Diodes 27 and 28 are connected in series between the junction of capacitor 13 and diode 16, and ground. These diodes are arranged to act as a clamp for the pulses which pass through capacitor 13 and they perform the same function as diode 20 in FIG. 1. A resistor 29 is connected between the cathode of diode 16 and ground. This resistor is made large enough so that it does not discharge capacitor 12 during the integrating cycle.

With the arrangement of FIG. 2 the clock pulse at terminal 19 causes the simultaneous application of a sample of the input voltage to one terminal of the comparator, a decrease in the previous integrator voltage across capacitor 11 and the application of the reduced integrator voltage to the other terminal of the comparator. The comparator and AND gate 24 then generate an incrementing pulse when the input analog voltage sample is larger than the integrator voltage. This incrementing pulse is then used to charge capacitor 11 through capacitor 13, diode 16 and FET 15. When the capacitors in the circuit are chosen in the proper ratio, the voltage at the integrator output terminal 10 will decrease by one unit on the occurrence of the clock pulse and increase by two units during the incrementing gate pulse whenever the analog voltage is larger than the integrating voltage. The net effect of this is to increase the integrating voltage by one unit. When a digital 0 is produced, indicating that the integrator voltage is larger than the input analog sample, no incrementing pulse is produced and the decrease in the integrator voltage remains. This integrator voltage is reduced during each cycle until it is larger than the input analog sample.

Figure 3:
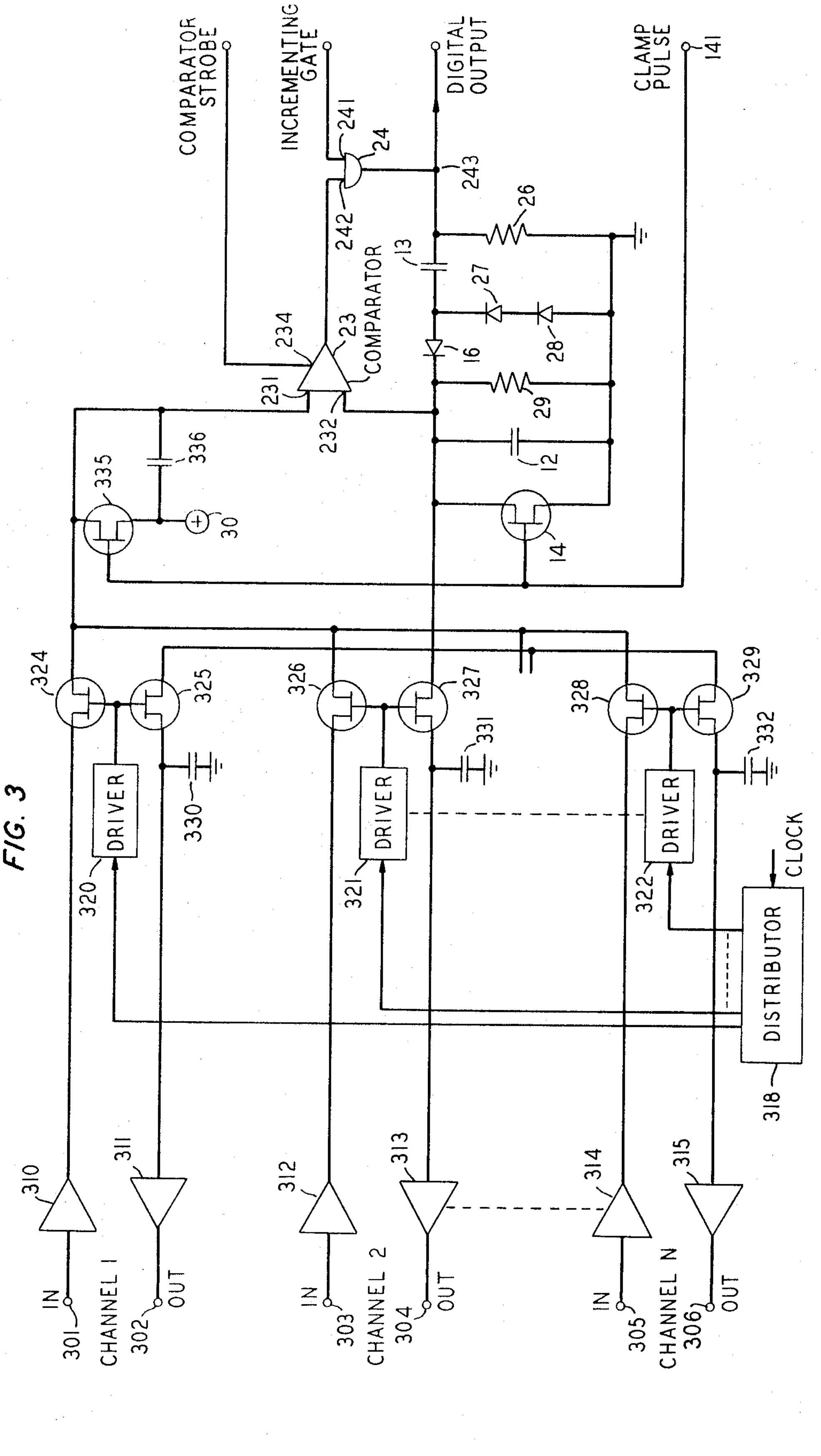
FIG. 3 is a schematic of an illustrative embodiment of the invention used in a time-division multiplex delta modulation system.

The circuit of FIG. 2 can also be used to great advantage in a time-division multiplex delta modulator, as illustrated in FIG. 3. The parts of the circuit shown in FIG. 3 which are the same as those in FIG. 2 have been given the same numerical designation. FIG. 3 shows an N channel time-division multiplex system with terminals 301, 303 and 305 representing the input terminals for N channels of analog signals. The signals applied to these terminals are amplified in amplifiers 310, 312 and 314, respectively. then the outputs of these amplifiers are applied through the drain-source paths of FETS 324, 326 and 328, respectively, to a common line which is attached to terminal 231 of comparator 23. A capacitor 336, which reduces the turn-on transient of FET 324, is connected between this terminal 231 and a positive voltage source 30. In parallel with capacitor 336 is the drain-source path of FET 335. The integrator outputs of the various multiplex channels are applied to terminals 302, 304 and 306 from output amplifiers 311, 313 and 315, respectively. The inputs for these amplifiers are derived from the integrating capacitors of each channel, represented by capacitors 330, 331 and 332. Each of these integrating capacitors is connected to a common line attached to input terminal 232 of comparator 23 through the drain-source paths of FETS 325, 327 and 329, respectively. During the operation of this circuit a local clock signal is applied to a pulse distributor 318. This distributor sequentially applies pulses to driver circuits 320, 321 and 322, which control the input and output FET gates. The charge parceling integrator section of the circuit of FIG. 3 is the same as that shown in FIG. 2 and consists of diodes 16, 27 and 28; resistors 26 and 29; and capacitors 12 and 13.

During the operation of this time-division multiplex encoder, analog signals are applied to the inputs of operational amplifiers 310, 312 and 314. Under the control of the distributor circuit, the first amplified analog signal is sampled by gate 324. At the same time, the voltage across capacitor 330, which was the previous integrating voltage for that channel, is decreased because it is connected in parallel with capacitor 12 by FET 325. This reduced voltage is applied to input terminal 232 of comparator 23. When the sampled analog voltage is larger than the reduced voltage on capacitor 330, the comparator circuit 23 in combination with AND gate 24 generates a digital 1 output, under the control of the comparator strobe pulse at terminal 234 and the incrementing gate pulse at terminal 241 of AND gate 24. This 1 output pulse then transfers charge through capacitor 13 to the parallel combination of capacitors 12 and 330, thereby causing the integrating voltage to increase. At the end of this charging process FETS 324 and 325 are opened, and the clamping pulse at terminal 141 causes FETS 14 and 335 to discharge capacitors 12 and 336, respectively. This prepares the circuit for inputs from the succeeding channels.

During the next pulse from distributor 318, the distributor causes driver circuit 321 to short circuit input and output FET gates 326 and 327. This causes a sample of the input voltage at terminal 303 to be applied to comparator input terminal 231 and decreases the voltage across integrating capacitor 331 because of capacitor 12. In a manner similar to the operation of channel 1, the sampled voltage and the integrating voltage are compared. When the integrating voltage is larger than the sampled voltage, a digital 0 is produced and there is no change in the integrating voltage. However, when the sampled voltage is larger than the integrating voltage, a digital 1 is produced by comparator 23 and AND gate 24. This causes an increase in the voltage across integrating capacitor 331 which is twice the decrease produced at the beginning of the cycle, thereby resulting in a net increase of one unit. At the end of this cycle capacitors 12 and 336 are again discharged by FETS 14 and 335. As additional clock pulses are received by the distributor the succeeding analog input signals are sampled and digital bits are generated by the circuit. After the distributor reaches the $N^{th}$ channel of the system, it activates the integrating process by causing driver 322 to force FETS 328 and 329 to short-circuit. In a manner similar to the previous channels, the input signal is sampled and compared with a reduced integrating voltage. Then a digital output signal, which depends on the comparison, is produced. The digital output signal determines whether the integrating capacitor for that channel, 332, will remain in the reduced state or will be increased in an effort to track the input voltage. Next the distributor causes the entire cycle to be repeated by returning to channel 1.

The stray capacitance of the common line can be used to decrement the integrating capacitor in place of capacitor 12 when the entire voltage range on the integrating capacitor is above the voltage to which the common line is clamped. This is easily accomplished by offsetting the output voltage of the input amplifiers. In any event, when a capacitor such as capacitor 12 or stray capacitance is used to decrement the integrating capacitor, the amplitude of the down-step decreases exponentially as the voltage on the integrating capacitor approaches zero. However, the amplitude of the up-step decreases exponentially as the voltage approaches its maximum value. When the modulator is tracking a dc voltage this difference in step size produces a ramp waveform. However, this ramp waveform does not cause in-band noise as long as its frequency is above the band of interest and, in fact, the idle channel noise is reduced because the low frequency noise due to random variations in the step pattern is modulated out-of-band by the superimposed ramp waveforms.

While the invention has been particularly shown and described with reference to preferred embodiments thereof, it will be understood by those skilled in the art that various changes in form and details may be made therein without departing from the spirit and scope of the invention.

I claim:

1. A charge parceling integrator for decoding a delta modulation digital signal, comprising:

a source of timing pulses for controlling the operation of said integrator;

a first capacitor having the digital signal applied to its first side;

means for unilaterally clamping the voltage at the second side of said first capacitor to a reference level;

a second capacitor having its first side connected to ground;

means for unilaterally coupling charge from the second side of said first capacitor to the second side of said second capacitor;

a third capacitor connected between the output of said integrator and ground;

a switching means for connecting the second side of said second capacitor to the output of said integrator in response to the timing pulses; and means for periodically discharging said second capacitor in response to the timing pulses.

2. A charge parceling integrator as claimed in claim 1 wherein said means for unilaterally clamping is a diode having its cathode connected to the second side of said first capacitor and its anode connected to ground.

3. A charge parceling integrator as claimed in claim 1 wherein said means for unilaterally coupling charge is a diode having its anode connected to the second side of said first capacitor and its cathode connected to the second side of said second capacitor.

4. A charge parceling integrator as claimed in claim 1 wherein said switching means is a field-effect transistor having its drain-source path connected between the second side of said second capacitor and the integrator output, and its gate connected to said source of timing pulses.

5. A charge parceling integrator as claimed in claim 1 wherein said means for periodically discharging is a field-effect transistor having its drain-source path connected across said second capacitor and its gate connected to said source of timing pulses.

6. A delta modulation encoder for converting an input analog voltage signal into digital pulses representing said analog voltage, comprising:

a source of timing pulses for controlling the operation of said encoder;

a two-input pulse generating means for generating a pulse synchronized with the timing pulses whenever the votlage at its first input is greater than the voltage at its second input;

a first integrating capacitor having its first side connected to ground;

A first switching means for connecting the input analog voltage to the first input of said pulse generating means and the second side of said first integrating capacitor to the second input of said pulse generating means in response to the timing pulses;

a decrementing capacitor connected between the second input of said pulse generating means and ground;

means for discharging said decrementing capacitor in response to the timing pulses;

a feedback capacitor having its first side connected to the output of said pulse generating means;

means for unilaterally clamping the voltage at the second side of said feedback capacitor; and means for unilaterally coupling charge from the second side of said feedback capacitor to the second input of said pulse generating means.

7. A delta modulation encoder as claimed in claim 6 further including:

a plurality of input analog signals;

a plurality of separate integrating capacitors, each associated with a separate input analog signal and each having its first side connected to ground;

a plurality of separate switching means for sequentially connecting each input analog signal to the first input of said pulse generating means and the second side of the integrating capacitor, associated with each input analog signal, to the second input of said pulse generating means, said plurality of switching means operating in response to the timing pulses; and means for discharging any voltage at the first input of said pulse generating means in response to the timing pulses, thereby allowing the delta modulation encoder to function as a time-division multiplex encoder for a plurality of input analog signals.

* * * * *